Dec. 11, 1973 C. L. HOLMES ET AL 3,778,305

ELECTRICALLY CONDUCTIVE ELEMENT AND METHOD OF MAKING THE SAME

Original Filed Aug. 2, 1968

INVENTORS
CURTIS L. HOLMES
LYNN J. BRADY
BY John J. Gaydos
ATTORNEY

United States Patent Office
3,778,305
Patented Dec. 11, 1973

3,778,305

ELECTRICALLY CONDUCTIVE ELEMENT AND METHOD OF MAKING THE SAME

Curtis L. Holmes, Elkhart, Ind., and Lynn J. Brady, Edwardsburg, Mich., assignors to CTS Corporation, Elkhart, Ind.

Original application Aug. 2, 1968, Ser. No. 749,890. Divided and this application June 14, 1971, Ser. No. 153,024
Int. Cl. B44d *1/18*
U.S. Cl. 117—212 14 Claims

ABSTRACT OF THE DISCLOSURE

An electrically conductive composition mixed with a screening agent, is deposited on a substrate and fired at an elevated temperature to form a termination bonded to the substrate. The composition comprises a homogeneous mixture of approximately 70–95% by weight co-precipitated platinum-gold alloy particles, co-precipitated palladium-gold alloy particles or co-precipitated platinum-palladium-gold particles and approximately 5–30% by weight of glass frit.

Figure 1:
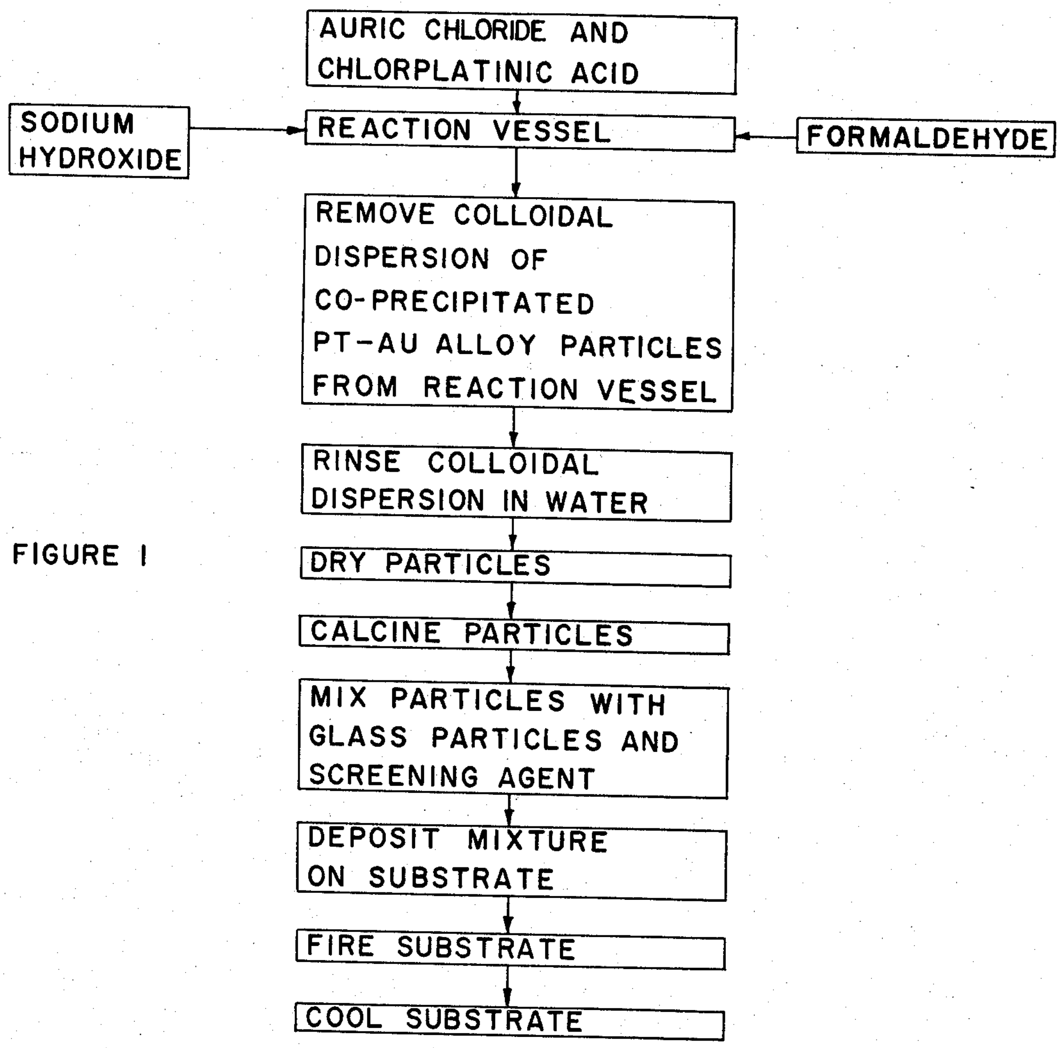

This is a division of application Ser. No. 749,890, filed Aug. 2, 1968.

The present invention relates to an electrically conductive element and, more particularly, to an electrically conductive composition and to a termination secured to the substrate of a circuit module and to a method of making same.

The demand for circuit modules employing active devices such as transistors and thick and thin film passive devices such as capacitors and resistors continues to increase substantially each year. Terminations, i.e., conductive patterns, are necessary for connecting the devices into electrical circuits. A great need exists in the industry for a thick film termination having good bonding characteristics for securing the termination to a substrate, good soldering characteristics for securing lead wires to the termination, sharp definition along the edges of the termination to permit close spacing of terminations and a low specific resistance. Gold, one of the noble metals, is preferably used as the conductive fraction of a termination because of its relatively low cost when compared to other noble metals such as platinum and palladium and because gold has a lower specific resistance than the other noble metals. Difficulties are, however, encountered in utilizing a termination comprising gold particles where a soldering operation is involved because gold dissolves rapidly in a hot lead-tin solder. Consequently a thicker layer of a conductive composition must be initially deposited onto the substrate to assure that adequate gold remains to form a good connection between a lead wire soldered to the termination and the active or passive device. It would therefore, be desirable to use gold as the conductive fraction of a termination without having the gold dissolve in the solder during the soldering operation.

Due to the malleability of gold, it is difficult to grind gold into small particles. When attempting to grind larger gold particles into smaller particles, many of the large particles flake and coat the mill, roller or other means employed for grinding the particles. If only small gold particles are utilized and mixed with glass particles in a screening vehicle, the small gold particles tend to agglomerate and, when the conductive material is screened onto the surface of a substrate, large islands of conductive particles surrounded by glass are formed. (Apparently agglomeration occurs because the small gold particles have opposite charges and are attracted to each other.) The agglomeration of the gold particles also causes lack of sharp definition at the edges of the termination. When currently available compositions for making terminations are deposited onto a substrate to form terminations with adjacent edges closer together than .020 inch, the conductive fraction of adjacent terminations bleeds sufficiently causing a short circuit between adjacent terminations. With the present invention, adjacent terminations can be deposited onto a substrate with a space of .005 inch therebetween without having the conductive fractions of the terminations bleed together.

Extensive tests have shown that a co-precipitated platinum-gold or palladium-gold alloy employed in a thick film termination has unique characteristics and properties. Since a co-precipitated platinum-gold alloy has substantially the same characteristics and properties as co-precipitated palladium-gold or platinum-palladium-gold alloy, it is to be understood that throughout this specification and claims where reference is made to a co-precipitated platinum-gold alloy that a co-precipitated palladium-gold or platinum-palladium-gold alloy may be substituted therefor. After the termination is fired and cooled, the thickness of a termination employing a platinum-gold alloy is less than a termination employing an unprecipitated platinum-gold alloy although both terminations have the same weight of conductive fraction and glass per square inch. The termination of the present invention also has a lower resistance per square than a termination made from unprecipitated platinum-gold conductive compositions even though the amount of conductive fraction is the same in both terminations. This decrease in the thickness and in the resistivity is due to a greater packing factor of the conductive fraction within the glass matrix which results from the small uniform size of the co-precipitated platinum-gold particles.

In the description following, a resistance unit expressed as "ohms per square" is used to designate the relative resistance values obtained. This unit is convenient where the resistance element is a film of known or constant thickness and has a constant width. Since the effective resistance is directly proportional to the length and inversely proportional to the width (the cross-sectional area for constant film thickness is directly proportional to width), the unit is rational as to dimensions. A square, therefore, represents an element of length of a termination whose elemental length dimension is equal to the width of the termination. In essence, the ohms per square defines the sheet resistance per square and is useful in comparing resistivities or conductivities of various types of films of the same thickness.

In general, the present invention relates to a composition containing co-precipitated platinum-gold alloy particles and glass frit and to a thick film termination produced from the composition and to a method of making the composition and the termination. By using a co-precipitated platinum-gold alloy, electrical conductivity, adhesion and edge definition of pattern of a termination are substantially increased, uniformity of particle size of the conductive fraction is increased and thickness of the termination is decreased.

An object of the present invention is to provide a new and improved conductive composition useful in making thick film terminations. Another object of the invention is to provide a new and improved method for making conductive compositions useful in making terminations. A further object of the invention is to provide a new and improved termination having good bonding characteristics, low specific resistance, sharply defined edges, good solderability, and good resistance to the removal of gold therefrom by molten lead-tin solder. Yet another object of the present invention is to provide a new and improved composition for a termination wherein a conductive fraction is comprised of finely divided particles of uniform size. Still another object of the invention is to provide a new and improved method of making a termination having the above described desirable characteristics.

Figure 2:
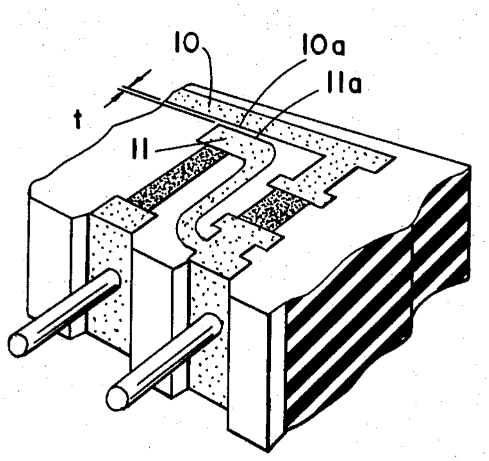

The subject matter regarded as our invention is set forth in the appended claims. The invention itself, however, together with further objects and advantages thereof may be better understood by referring to the following description taken in connection with the accompanying drawing wherein:

FIG. 1 is a flow diagram of one form of the method of this invention employed for producing improved compositions and thick film terminations; and FIG. 2 is a grossly enlarged fragmentary isometric view of adjacent thick film terminations made in accord with the present invention.

Referring to FIG. 1, the electrical thick film termination of the present invention, i.e., a termination having a thickness of from 0.0002 to 0.003 inch, is obtained by applying a conductive composition containing conductive particles of a co-precipitated platinum-gold alloy, a glass frit and an organic vehicle onto a substrate and firing the substrate and composition to drive off any organic vehicle present in the composition and fuse the glass frit into a glass matrix with the conductive particles embedded therein. The substrate may be of a suitable electrically nonconducting material capable of withstanding the elevated temperatures normally employed for firing a conductive composition. Various ceramic materials such as steatite, alumina, and fosterite are examples of preferred materials for making the substrate. The formula by weight for the glass frit used in the practice of the present invention may be any one of several ordinarily used in the art, and an example thereof having a softening temperature of approximately 750° C. is as follows:

| | Percent |
|---|---|
| $Bi_2O_3$ | 93.0 |
| $B_2O_3$ | 3.5 |
| $SiO_2$ | 3.5 |

The uniformly divided co-precipitated platinum-gold alloy particles are mixed with a glass frit comprising finely divided glass particles siftable through a 325 mesh screen in the following proportions (percentages by weight):

| Co-precipitated platinum-gold alloy | Percent: Permissible proportions | Percent: Preferable proportions |
|---|---|---|
| Alloy | 70–98 | 80–90 |
| Glass particles | 2–30 | 10–20 |

The co-precipitated platinum-gold alloy and glass mixture is combined with a suitable organic vehicle well known in the art such as ethyl cellulose dissolved in acetylcholine ($C_7H_{17}NO_3$) if the mixture is to be screened onto a flat surface of a substrate. A ratio of about four (4) parts of a platinum-gold alloy alloy-glass mixture to one (1) part organic vehicle forms a composition having the proper viscosity for screening the composition onto the surface of a substrate.

In preparing the platinum-gold alloy, 25 percent concentration of sodium hydroxide (NaOH) is mixed with an excessive amount of formaldehyde (HCHO) and deposited into a reaction vessel of the standard type commonly used in a chemical laboratory or a chemical industrial plant and continually agitated. An aqueous solution of auric chloride $AuCl_3$ ($Au_2Cl_6$) and chlorplatinic acid ($H_2PtCl_6$) is slowly introduced into the reaction vessel by pumping, the rate being adjusted to keep the temperature of the reaction preferably under 50° C. while water flows through the coils of the reaction vessel. When the gold and platinum compounds in solution are introduced into the reaction vessel, gold and platinum are instantly reduced and irreversibly co-precipitated to form a colloidal dispersion of platinum-gold alloy particles in water which settles to the bottom of the reaction vessel. Additional quantities of a suitable reducing agent such as formaldehyde (HCHO) and sodium hydroxide are added at suitable intervals during the co-precipitation process to assure that there is an excess of formaldehyde in order to obtain complete uniform co-precipitation. Any other reducing agent such as hydrazine compatible with the metals and miscible with water for precipitating the metals out of solution can also be used. A sufficient amount of sodium hydroxide for controlling the pH factor is maintained in the reaction vessel to assure that the solution is basic.

The colloidal dispersion of co-precipitated platinum-gold alloy particles is removed from the reaction vessel and rinsed with water. After the colloidal dispersion is sufficiently rinsed in water to remove all but a negligible amount of chloride and other impurity ions, the particles are dried at room or elevated temperatures to remove water chemically bonded to the alloy particles. The dried platinum-gold alloy particles are irreversibly separated from the aqueous phase in which they are produced. By "irreversibly separated" is meant that once the platinum-gold alloy particles have been co-precipitated and the water has been evaporated from the particles, the alloy particles cannot be redispersed in water or an organic media. Immediately after evaporation, the platinum-gold alloy particles have a particle size of approximately .3 micron. The alloy particles are then calcined to increase the particle size to about .45 micron. Since the alloy particles are substantially of uniform size, terminations 10 and 11 can be obtained having sharply defined edges **10*a* and 11*a* as shown in FIG. 2. Since the edges 10*a*, 11*a* are sharply defined, the terminations 10, 11** may be spaced very close to each other and the dimension *t* may be as small as .005 inch.

When a platinum-palladium-gold alloy is desired, a palladium-chloride solution is mixed with the platinum-gold solution and the mixture is then pumped into the reaction vessel to co-precipitate colloidal particles of a platinum-palladium-gold alloy.

The following examples are given to illustrate certain preferred details of the invention, it being understood that the details of the examples are not to be taken in any way as limiting the invention thereto.

The powdered glass particles forming the glass matrix of the conductive termination can be made of various glasses or vitreous material having a softening point below the temperature at which the base or substrate deforms. For instance, the glass can be bismuth trioxide ($Bi_2O_3$), or a bismuth borate glass ($2Bi_2O_3 \cdot B_2O_3$). If a higher temperature glass is desired, then silica ($SiO_2$) is added to the bismuth trioxide glass.

The following table discloses examples of glass frit compositions A, B, and C suitable for use in producing the conductive terminations of the present invention.

| | Percent by weight: A | B | C |
|---|---|---|---|
| $Bi_2O_3$ | 100 | 95 | 94 |
| $B_2O_3$ | 0 | 5 | 3 |
| $SiO_2$ | 0 | 0 | 3 |

Minor amounts of ZnO, CaO, BaO, MgO, $ZrO_2$, $Al_2O_3$ can be added to each of the above compositions in amounts of 1 to 2 percent by weight.

The invention is illustrated by the following examples in which all parts are by weight unless otherwise indicated.

EXAMPLE I 12.5 parts of bismuth trioxide frit identified above as composition A was mixed with 87.5 parts of co-precipitated platinum-gold alloy particles and 25 parts screening agent was added to the mixture to form a composition which could be screened on the surface of a substrate. The alloy consisted of 68.75 parts gold and 18.75 parts platinum. The resulting platinum-gold composition was deposited onto a ceramic substrate by a screening process and the substrate was fired at 750° C. to drive off the volatile ingredients and produce a conductive termination bonded to the substrate.

EXAMPLE II

A platinum-gold composition was prepared and deposited onto the surface of a ceramic substrate as described in Example I with the exception that the glass used in the platinum-gold composition was that identified above as composition C and was made by combining three parts of $B_2O_3$ and three parts of $SiO_2$ with 94 parts of $Bi_2O_3$. The substrate was then fired at 750° C. to drive off the volatile ingredients to produce a conductive termination bonded to the substrate.

EXAMPLE III

A co-precipitated alloy of platinum, palladium and gold particles containing four (4) parts platinum, fifty (50) parts palladium and thirty (30) parts gold was mixed with sixteen (16) parts of the glass employed in Example II. The resulting mixture was then combined with thirty-two (32) parts of an organic vehicle or screening agent to produce the proper viscosity for screening the composition onto the surface of a substrate. The substrate was then fired at 750° C. to drive off the volatile ingredients to produce a conductive termination bonded to the substrate.

The following table shows the average characteristics of ten (10) terminations of the present invention corresponding to the above Examples II and III and the average characteristics of ten (10) terminations having the same metal ratio but in an unprecipitated state. In each of the test terminations, the same percentages of glass and screening agent were used.

| | Termination | | |
|---|---|---|---|
| Properties | Pt-Au alloys, Example II | Unprecipitated Pt and Au | Pt-Pd-Au alloys, Example III |
| Metal ratio | 1:4 | 1:4 | 4:50:30 |
| Metal content (percent) | 87.5 | 87.5 | 87.5 |
| Glass | 12.5 | 12.5 | 12.5 |
| Resistance, ohm/sq | 0.06 | 0.08 | 0.06 |
| Pull strength, pounds | 17 | 6 | 17 |
| Thickness | 0.00072 | 0.00113 | .00071 |
| Density, gms/cc | (1) | 3.2 | 4.4 |

1 5.9 gms./cc3.

The above test results shown in column 1 for terminations made in accord with Example II were substantially identical when a co-precipitated palladium-gold alloy was substituted for the coprecipitated platinum- gold alloy. Neither were any differences in test results detected when palladium was substituted for platinum for the terminations indentified in column 2.

From an analysis of the test results, it will be appreciated that by following the teachings of the present invention terminations can be made having significantly reduced values of specific resistance when compared to terminations made from unprecipitated materials. Thus, the termination of Examples II and III displayed a resistance of 0.06 ohm per square, or a 25 percent reduction in resistivity as compared to the termination yielding the data in column 2 of the above table. In addition, the pull strength, or amount of force (17 lbs.) required to lift .050 inch by .050 inch square terminations made according to Examples II and III from an alumina substrate was nearly three times greater than the force (6 lbs.) required in tests of terminations made from unprecipitated materials. This greatly increased pull strength is, of course, a direct measurement of the improved adhesive or bonding characteristics of the terminations of Examples II and III. During the preparation for various tests, it was also observed that the terminations of Examples II and III were not subject to dissolution of the gold portion of the coprecipitated alloy in a lead-tin solder. It was also observed that the Example II and III terminations were readily solderable and this phenomena was believed to be caused by the substantially uniform size and close spacing of the co-precipitated alloy particles. This close spacing of co-precipitated alloy particles in turn results in the compositions and terminations of Examples II and III having a relatively high "packing factor" as evidenced by an increase in density of from 38 to 85 percent, and a 63 percent decrease in termination thickness, in comparison with compositions and terminations made from unprecipitated materials.

As will be understood, the above description is for purposes of description of the present invention in general and of the terminations of Examples II and III in particular. Thus, depending on the ratio of one metal to another present in the co-precipitated alloy, and depending on the relative amount of glass used, the specific resistance, pull strength, thickness, and density may vary. For example, when the amount of glass used varies from 2 to 30 percent, the density of a platinum-gold co-precipitated alloy may vary from 4.7 grams per cc. to 6.5 grams per cc.

Accordingly, while there has been illustrated and described what is at present considered to be a preferred embodiment of the present invention and a method of making the same and additional modifications thereof, it will be appreciated that numerous changes and modifications are likely to occur to those skilled in the art, and it is intended in the appended claims to cover all those changes and the modifications which fall within the true spirit and scope of the present invention.

What is claimed as new and desired to be secured by Letters Patent of the United States is:

1. A termination fired on a surface of an electrically nonconductive substrate adjacent to an electrical circuit element, said termination comprising a film of conductive material formed of a matrix of solidified glass with uniformly sized particles less than 20 microns in size of a ternary conductive alloy comprising gold, platinum and palladium dispersed throughout the solidified glass.

2. The termination of claim 1 wherein said film of conductive material comprises 2 to 30 percent by weight of solidified glass, and 70 to 98 percent by weight of said ternary conductive alloy.

3. The termination of claim 1 wherein said film of conductive material comprises 10 to 20 percent by weight of solidified glass, and 80 to 90 percent by weight of said ternary conductive alloy.

4. The termination of claim 1, wherein the ratio of palladium and platinum to gold is at least 1.5 to 1.

5. A termination comprising a high-temperature resistant, electrically nonconductive substrate having fired thereon, a film of conductive material formed of a matrix of solidified glass with uniformly sized particles of a co-precipitated ternary conductive alloy comprising gold, platinum, and palladium dispersed throughout the solidified glass.

6. The termination of claim 5 wherein said film of conductive material comprises 2 to 30 percent by weight of solidified glass, and 70 to 98 percent by weight of said ternary conductive alloy.

7. The termination of claim 5 wherein said film of conductive material comprises 10 to 20 percent by weight of solidified glass, and 80 to 90 percent by weight of said ternary conductive alloy.

8. The termination of claim 5 wherein the resistivity is less than 0.08 ohm per square per .001 inch thickness.

9. The termination of claim 5 wherein the density of the solidified glass and alloy is between 6.5 to 4.7 gms./cc. when the percent of glass is between 2 to 30 percent by weight and the percent alloy is between 70 to 98 percent by weight.

10. A method of forming a termination composed of a co-precipitated alloy of gold, platinum and palladium on a ceramic dielectric substrate comprising the steps of: introducing a platinum-gold solution and a palladium solution into a reaction vessel containing a reducing agent, co-precipitating the gold, platinum, and palladium in the reaction vessel to form a colloidal dispersion containing uniformly sized gold-platinum-palladium alloy particles less than 20 microns in size, rinsing the colloidal dispersion in a liquid solution to remove impurity ions, drying the alloy particles to remove the liquid therefrom, mixing the alloy particles with glass particles, adding a screening agent to the mixture to form a composition, depositing the composition onto a substrate, firing the composition on the substrate at the temperature between about 600° C. and 1200° C. to form a termination, and cooling the termination to room temperature.

11. A method of making the termination of claim 10, wherein the dried alloy particles are calcined to increase the size thereof.

12. A method of making the termination of claim 10, wherein the mixture of alloy particles and glass particles is about 70 to 98 percent by weight alloy particles and about 2 to 30 percent by weight glass particles.

13. A method of making the termination of claim 11, wherein the size of the alloy particles is increased between .3 to .45 micron by calcining.

14. A method of making the termination of claim 10, wherein the platinum, gold solution comprises auric chloride and chlorplatinic acid and the palladium solution comprises palladium chloride.

References Cited

UNITED STATES PATENTS

| | | | |
|---|---|---|---|
| 3,547,604 | 12/1970 | Davis, Jr., et al. | 117—212 X |
| 3,385,799 | 5/1968 | Hoffman | 252—514 |
| 3,537,892 | 11/1970 | Milkovich et al. | 252—514 X |
| 3,347,799 | 10/1967 | Wagner | 252—514 |
| 3,413,240 | 11/1968 | Short | 252—514 |
| 3,252,831 | 5/1966 | Ragan | 252—514 X |

EDWARD G. WHITBY, Primary Examiner

29—629, 630 R; 252—514; 317—234 R